US011228089B2

(12) United States Patent
Wu et al.

(10) Patent No.: US 11,228,089 B2
(45) Date of Patent: Jan. 18, 2022

(54) ANTENNA PACKAGING MODULE AND MAKING METHOD THEREOF

(71) Applicants: SJ SEMICONDUCTOR (JIANGYIN) CORPORATION, JiangYin (CN); HUAWEI DEVICE CO., LTD., Dongguan (CN)

(72) Inventors: Chengtar Wu, JiangYin (CN); Rui Yu, JiangYin (CN); Chengchung Lin, JiangYin (CN); Xianghui Zhang, JiangYin (CN)

(73) Assignees: SJ Semiconductor (Jiangyin) Corporation, Jiangyin (CN); Hauwei Device Co., Ltd., Dongguan (CN)

( * ) Notice: Subject to any disclaimer, the term of this patent is extended or adjusted under 35 U.S.C. 154(b) by 0 days.

(21) Appl. No.: 16/935,550

(22) Filed: Jul. 22, 2020

(65) Prior Publication Data

US 2021/0066783 A1 Mar. 4, 2021

(30) Foreign Application Priority Data

Jul. 22, 2019 (CN) .......................... 201910661882.9
Jul. 22, 2019 (CN) .......................... 201921158042.2

(51) Int. Cl.
*H01Q 1/38* (2006.01)
*H01Q 1/22* (2006.01)
*H01Q 23/00* (2006.01)

(52) U.S. Cl.
CPC ............. *H01Q 1/2283* (2013.01); *H01Q 1/38* (2013.01); *H01Q 23/00* (2013.01)

(58) Field of Classification Search
CPC .............................. H01Q 1/2283; H01Q 1/38
See application file for complete search history.

(56) References Cited

U.S. PATENT DOCUMENTS 10,109,604 B2 * 10/2018 Topak .................. H01L 23/645
2011/0037164 A1 * 2/2011 Kwon ................ H01L 21/4857
257/709
2014/0152509 A1 * 6/2014 Liu ...................... H01Q 9/0407
343/700 MS

* cited by examiner

*Primary Examiner* — Peguy Jean Pierre
(74) *Attorney, Agent, or Firm* — Alston & Bird LLP

(57) ABSTRACT

The application describes an antenna packaging module for a semiconductor chip and a method for making it. The antenna packaging module comprises a redistribution layer, an antenna structure, a semiconductor chip, a metal bump, a third packaging layer and a packaging antenna connector. The antenna structure comprises a connector opening, a first antenna structure and a second antenna structure stacked on the second surface of the redistribution layer. The packaging antenna connector is disposed in the connector opening, and is electrically connected to the redistribution layer. Electrical interconnection of packaging an antenna connector in a connector opening in the packaging layer, the antenna signal loss is reduced, and the overall e advantage of WLP AiP is further improved.

18 Claims, 5 Drawing Sheets

ANTENNA PACKAGING MODULE AND MAKING METHOD THEREOF

CROSS REFERENCES TO RELATED APPLICATIONS

This application claims the benefits of priorities to Chinese Patent Applications No. CN 2019106618829, entitled "An Antenna Packaging Module and A Making Method Thereof", CN 2019211580422, entitled "An Antenna Packaging Module", both filed with CNIPA on Jul. 22, 2019, the contents of which are incorporated herein by reference in their entireties.

TECHNICAL FIELD

The present disclosure relates to the technical field of semiconductor chip packaging, and in particular, to an antenna packaging module and a method of making the same.

BACKGROUND

With the widely applied advanced electronic products, especially for those of mobile use, almost all of these products require built-in wireless communication functions.

Based on the wireless communication device is often built-in chip packaging. One technique Antenna in Packaging (AiP) integrates communication antennas and chips through packaging materials and process. AiP achieves systemic wireless communication. The advantages of AiP include simplified system design, miniatured products and low cost. AiP provides a good antenna in a packaging solution for wireless chips. Under demand of rapid expansion of communication data, AiP has become one of the preferred technologies for 5G communication and in auto-radar chips. As a result, AiP technology has drawn great attention.

In a convectional or partial packaging method, AiP module, antennas are usually directly prepared on a printed circuit board. These antennas interconnect to external environment through connectors mounted on the circuit board, where one surface of the circuit board acts as a radiation surface, and the other surface of the circuit board connects chips and the main structure. The achievability of this partial packaging method is low. It is not compact for modulation and interconnection, because the antennas occupy extra space on the circuit board, resulting in poor integration. For various advanced electronic products, the volume of the circuit board turns out to be bulky if the antennas are directly built on the circuit board. Thus, formed electronic products tend to be large as well. Contrary to the need of miniaturization requirement of these advanced electronic products.

On the other hand, wafer-level packaging-antenna (WLP AiP) technology patterns antennas on the packaging layers on a wafer along with the integrated circuits. Compared with the conventional AiP module, WLP AiP has better accuracy and smaller size. WLP AiP has been more widely applied than AiP. However, the present WLP AiP is not supported by current core layers. Plus, the current redistribution layer (RDL) is too thin to interconnect to other components through both surfaces of RDL. Current WLP AiP still relies on the main circuit board to achieve external connection, unable to avoid high loss of packaged antenna. Furthermore, the metal wire ends from the flip-chip interconnect process of current WLP AiP limit the flexibility where the antenna packaging layout is located.

A need exists to have antenna interconnection packaged in a way which can solve the problems of AiP signal loss and layout limitation on the main board.

SUMMARY

The present disclosure provides a method for making antenna packaging module, including the following steps: providing a packaging antenna structure, comprising; providing a substrate; disposing a redistribution layer on the substrate, wherein the redistribution layer comprises: a first surface and a second surface opposite to the first surface; an antenna structure, the antenna comprising a first antenna structure and a second antenna structure stacked on the second surface of the redistribution layer; wherein the first antenna structure includes a first antenna feeder line, a first antenna metal layer and a first packaging layer, wherein a first end of the first antenna feeder line is electrically connected to the redistribution layer, and the first packaging layer encloses the second surface of the redistribution layer and the first antenna feeder line, and exposes a second end of the first antenna feeder line, the first antenna metal layer is disposed on the first packaging layer and electrically connected to the second end of the first antenna feeder line; wherein the second antenna structure includes a second packaging layer and a second antenna metal layer, wherein the second packaging layer encloses the first antenna metal layer and the first packaging layer, and the second antenna metal layer is disposed on the second packaging layer; providing a semiconductor chip, wherein the semiconductor chip is disposed on the first surface of the redistribution layer, and electrically connected with the redistribution layer; providing a metal bump, wherein the metal bump is disposed on and electrically connected to the first surface of the redistribution layer; disposing a third packaging layer, wherein the third packing layer embeds the semiconductor chip and the first surface of the redistribution layer, except exposing the metal bump; forming an opening in the antenna structure; and forming a connector of packing antenna in the opening, wherein the connector is electrically connected with the first surface of the redistribution layer.

Preferably, the packaging antenna connector is interconnected with the circuit board connector; the circuit board comprises one or the combination of a flexible circuit board and a rigid circuit board.

Preferably, the first antenna structure further comprises a metal column and a metal connector, the first end of the metal column is electrically connected to the redistribution layer, the first packaging layer embeds the metal column except exposing the second end of the metal column, the metal connector is disposed on the first packaging layer and electrically connected to the second end of the metal column; the bottom of the connector opening exposes the metal connector, the packaging antenna connector is electronically connected to the metal connector, so that the metal connector and the metal column are electrically connect to the redistribution layer.

Preferably, the metal wiring of the redistribution layer is exposed from a bottom of the connector opening, and the packaging antenna connector is electrically connected to the metal wiring.

Preferably, a dielectric layer is disposed between the first antenna structure and the second antenna structure.

Preferably, the second antenna structure further comprises a second antenna feeder line disposed between the second antenna metal layer and the first antenna metal layer, and the second antenna metal layer is connected to the first antenna metal layer via the second antenna feeder line.

Preferably, forming packaging antenna connector on the opening of connector comprises one or the combination of reflow welding and laser welding.

Preferably, forming the first antenna feeder line comprises one or a combination of wire bonding, electroplating, and electroless plating, and the material of the first antenna feeder line includes one or a combination of copper, gold, silver, and aluminum.

Preferably, forming the connector opening comprises one or a combination of dry etching and wet etching.

Preferably, the semiconductor chip comprises one or a combination of active component and passive component; the active component comprises one or a combination of a transceiver chip and a power management chip; the passive component comprises one or a combination of resistors, capacitors and inductors.

The present disclosure further discloses a packaging antenna module, comprising: a substrate and a separating layer; a redistribution layer, wherein the redistribution layer comprises a first surface on the separating layer and a second surface opposite to the first surface; an antenna structure, wherein the antenna structure comprises a first antenna, a second antenna stacked on the second surface of the redistribution layer and a connector opening; wherein the first antenna structure includes a first antenna feeder line, a first antenna metal layer and a first packaging layer, wherein a first end of the first antenna feeder line is electrically connected to the redistribution layer, wherein the first packaging layer is disposed on the first antenna feeder line leaving a second end of the first antenna feeder line exposed, wherein the first antenna metal layer is disposed on the first packaging layer and electrically connected to the second end of the first antenna feeder line; wherein the second antenna structure includes a second packaging layer and a second antenna metal layer, wherein the second packaging layer is disposed on the first antenna metal layer, and wherein the second antenna metal layer is disposed on the second packaging layer; a semiconductor chip, wherein the semiconductor chip is disposed on the first surface of the redistribution layer, and electrically connected to the redistribution layer; a metal bump, wherein the mental bump is disposed on the first surface of the redistribution layer, and electrically connected to the redistribution layer; a third packaging layer, wherein the third packaging encloses the semiconductor chip and the first surface of the redistribution layer, and exposing the metal bump; and a packaging antenna connector, wherein the packaging antenna connector is disposed in the connector opening, and electrically connected to the redistribution layer.

Preferably, the packaging antenna connector is electrically connected with a circuit board connector on the circuit board; the circuit board comprises one or a combination of a flexible circuit board and a rigid circuit.

Preferably, the first antenna structure further comprises a metal column and a metal connector, the first end of the metal column is electrically connected to the redistribution layer, and the first packaging layer embeds the second surface of the redistribution layer and the metal column, and the metal connector is located on the first packaging layer and electrically connected to the second end of the metal column; wherein the bottom of the connector opening exposes the metal connector, the packaging antenna is electrically connected to the metal connector.

Preferably, a metal wiring of the redistribution layer is exposed at a bottom of the connector opening, and the packaging antenna connector is electrically connected to the metal wiring.

Preferably, a dielectric layer is disposed between the first antenna structure and the second antenna structure.

Preferably, the second antenna structure further comprises a second antenna feeder line disposed between the second antenna metal layer and the first antenna metal layer, and the second antenna structure is connected to the second antenna metal layer and the first antenna metal layer via the second antenna feeder line.

Preferably, the first antenna feeder line comprises one or a combination of a copper feeder line, a gold feeder line, a silver feeder line, and an aluminum feeder line.

Preferably, the semiconductor chip comprises one or a combination of active component and passive component; wherein the active component comprises one or a combination of a transceiver chip and a power management chip; wherein the passive component comprises one or a combination of resistors, capacitors and inductors.

DESCRIPTIONS OF REFERENCE NUMERALS

| | |
|---|---|
| 101 | Support substrate |
| 102 | Separation layer |
| 103, 203 | Redistribution layer |
| 113, 213 | Wiring dielectric |
| 123, 223 | Metal wiring |
| 104, 204 | First antenna structure |
| 1141, 214 | First feeder line |
| 1142 | Metal column |
| 124, 224 | First packaging layer |
| 1341, 234 | First antenna metal layer |
| 1342 | Metal connector |
| 105, 205 | dielectric layer |
| 115 | connector opening |
| 106, 206 | Second antenna structure |
| 116, 216 | Second packaging layer |
| 126, 226 | Second antenna metal layer |
| 107, 207 | Semiconductor chip |
| 108, 208 | Third packaging layer |
| 109, 209 | Mental bump |
| 110, 210 | Connector |
| 111, 211 | Packaging antenna connector |
| 112, 212 | Circuit board connector |
| 120, 220 | Circuit board |

DETAILED DESCRIPTION OF THE PREFERRED EMBODIMENTS

Implementations of the present disclosure are described below by using particular and specific examples, and a person skilled in the art can easily understand other advantages and efficacy of the present disclosure from content disclosed in the specification. The present disclosure can further be implemented or applied by using other different specific implementations, details in the specification can further be based on different opinions and applications, and various modifications and changes can be made without departing the spirit of the present disclosure.

It should be noted that, figures provided in embodiments describe the basic idea of the present disclosure only in a schematic manner. Only components related to the present disclosure are shown in the figures instead of drawing components based on the quantity, the shape, and the size of the components required during actual implementation. The shape, the quantity, and the ratio of each component during actual implementation can be changed randomly, and the layout shape of the components may be more complicated.

Embodiment 1

Figure 8:
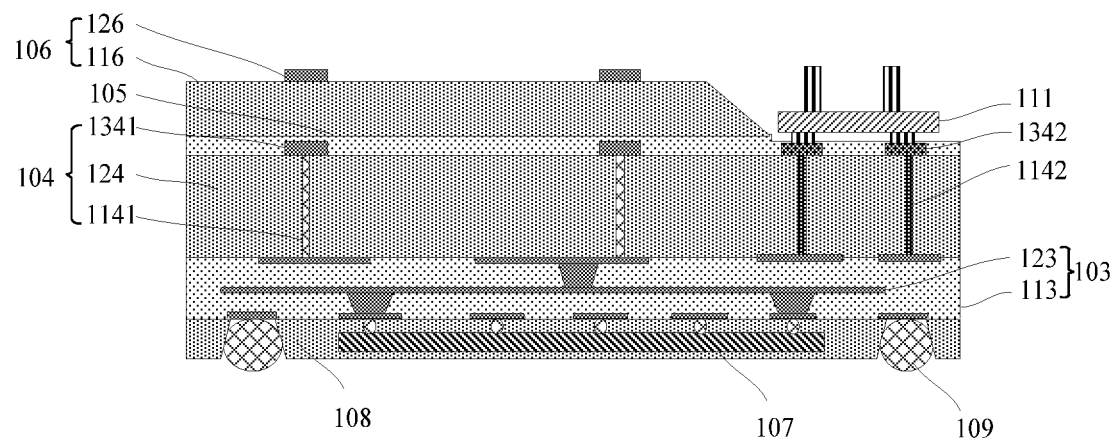
FIG. 8 is a schematic diagram of the packaging antenna module according to the first embodiment of the present disclosure.

FIG. 8 provides an overview of the antenna packaging module structure in the embodiment 1. In FIG. 8, there is an antenna packaging module which includes a redistribution layer 103, an antenna structure, a semiconductor chip 107, a third packaging layer 108, a metal bump 109, and a packaging antenna connector 111. The redistribution layer 103 induces the first surface and the second surface opposite to the first surface. The antenna structure includes a connector opening, at least a first antenna structure 104 and a second antenna structure 106. The first antenna structure 104 and the second antenna structure 106 stack on the second surface of the redistribution layer 103. The first antenna structure 104 includes a first antenna feeder line 1141, a first antenna metal layer 1341, and a first packaging layer 124. The first end of the first antenna feeder line 1141 is electrically connected with the redistribution layer 103. The first packaging layer 124 embeds the first antenna feeder line 1141 only exposing the second end of the first antenna feeder line 1141. The first antenna metal layer 1341 is disposed on the packaging layer 124, and is electrically connected to the second end of the first antenna feeder line 1141. The second antenna structure 106 includes a second packaging layer 116 and a second antenna metal layer 126. The second packaging layer 116 encloses the first antenna metal layer 1341. The second antenna metal layer 126 is disposed on the second packaging layer 116. The semiconductor chip 107 is disposed on the first surface of the redistribution layer 103 and electrically connected to the wiring layer 103. The metal bump 109 is disposed on the first surface of the redistribution layer 103 and is electrically connected to the redistribution layer 103. The third packaging layer 108 encloses the semiconductor chip 107 and the first surface of the redistribution layer 103, and exposes the metal bump 109. The packaging antenna connector 111 is disposed in the connector opening 115 and is electrically connected to the redistribution layer 103.

In the package antenna module of the embodiment, the package antenna connector disposed in the connector opening is electrically connected to the rewiring layer through the connector opening, and the package antenna connector is electrically extracted. The package antenna module directly interconnects with the external, thereby reducing signal loss and further improving the overall competitive advantage of WLP AiP.

Figure 1:
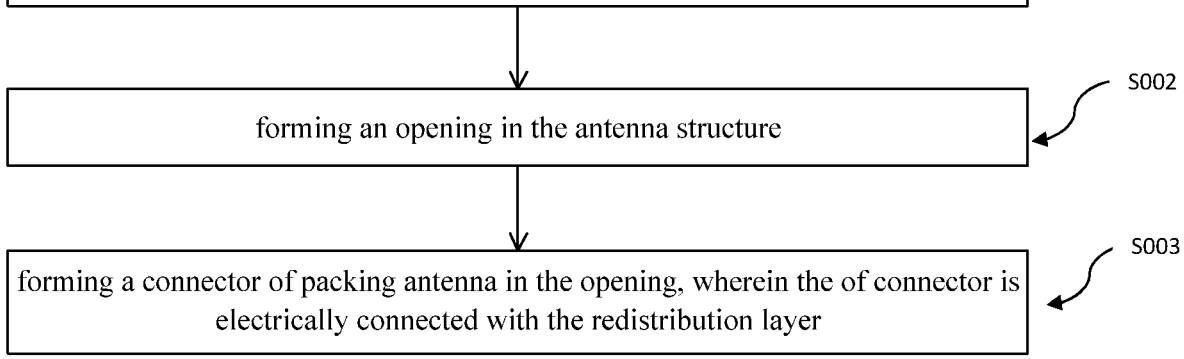
FIG. 1 is a flow chart illustrating the process of making the packaging antenna module according to the present disclosure.

As shown in FIG. 1, the embodiment provides a flow chart of a method how to make the packaging antenna module, but the method is not limited herein.

There are 3 major steps making the antenna packaging module, described in the following text.

S001: fabricate a packaging antenna structure;
S002: forming an opening in the antenna structure;
S003: forming a connector in the opening, which is electrically connected to the RDL.

Specifically, as shown in FIGS. 2 to 8, schematic diagrams illustrate the packaging antenna module after each step in the method according to the embodiment.

Figure 2:
FIGS. 2 to 7 are schematic diagrams after the steps of making the packaging antenna module according to the first embodiment of the present disclosure.

Referring to FIG. 2, a support substrate 101 is first provided, and a separation layer 102 is formed on the support substrate 101.

Specifically, the support substrate 101 may be selected from a glass substrate, a metal substrate, a semiconductor substrate, a polymer substrate and a ceramic substrate. The separation layer 102 may include a polymer layer having a reduced viscosity under heat treatment or illumination, and the polymer layer may include a light-to-heat conversion (LTHC) layer. Choosing a glass substrate might be preferred because its cost is low and also forming the separation layer 102 on the surface of a glass substrate reduces some challenges of subsequent peeling process. The separation layer 102 is preferably coated on the surface of the support substrate 101 by a spin coating process, followed by curing with UV light or heat treatment to form a LTHC layer. In the subsequent stripping process, the LTHC layer can be heated to separate from the support substrate 101 with laser light.

Figure 3:
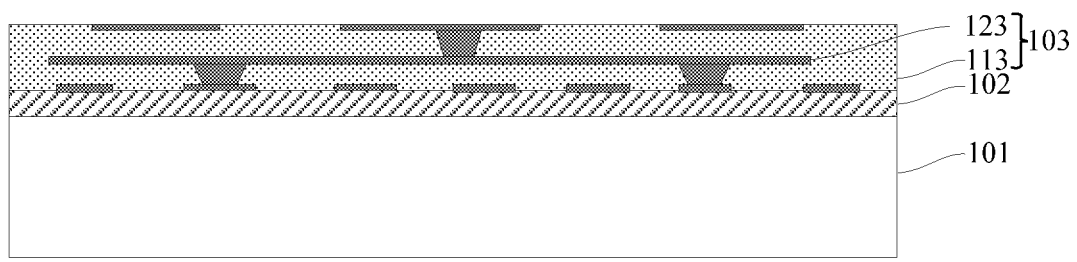

As shown in FIG. 3, the redistribution layer 103 is formed on the separation layer 102. The redistribution layer 103 includes a first surface contacting the separation layer 102 and a second surface opposite to the first surface.

Specifically, the redistribution layer 103 includes a wiring dielectric 113 and a metal wiring 123. The material of the wiring dielectric 113 may include one or a combination of epoxy resin, silica gel, polyimide (PI), phenylene benzabisoxazole (PBO), benzocyclobutene (BCB), silicon oxide, phosphosilicate glass, and fluorine-containing glass. The material of the metal wiring 123 may include one or a combination of copper, aluminum, nickel, gold, silver, and titanium. The method for making the wiring dielectric 113 may include one or a combination of physical vapor deposition and chemical vapor deposition. The method for making the metal wiring 123 may include one or a combination of physical vapor deposition, chemical vapor deposition, electroplating, and electroless plating. The specific materials, the number of layers, and the distribution of the wiring dielectrics 113 and the metal wiring 123 can be selected according to specific needs, which are not limited herein.

Figure 4:
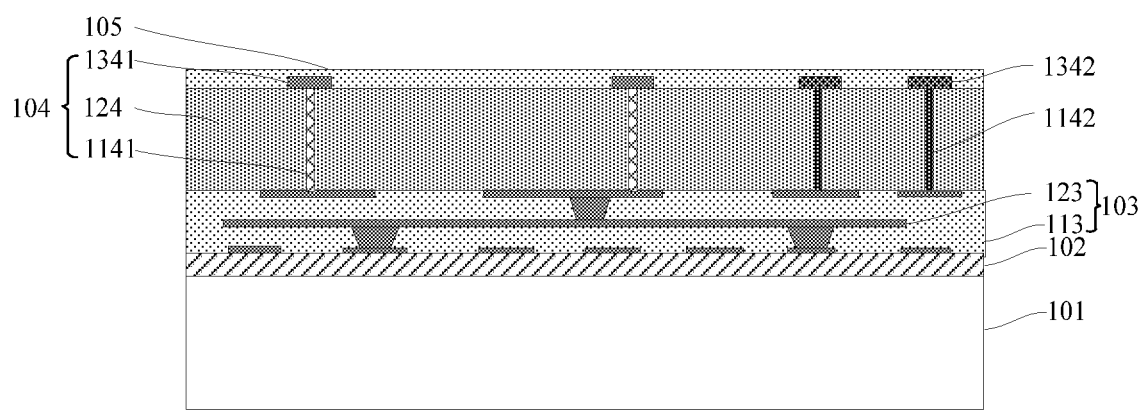

As shown in FIG. 4, forming the first antenna structure 104 on the second surface of the redistribution layer 103.

Exemplarily, the first antenna structure 104 may further include metal columns 1142 and a metal connector 1342. The first end of the metal column 1142 is electrically connected to the second surface of the redistribution layer 103. The first packaging layer 124 is disposed on the second surface of the redistribution layer 103 and embedding the metal column 1142, however, the second end of the metal column 1142 are exposed. Each metal connector 1342 is disposed on the first packaging layer 124, is then patterned to align to the second end of the metal column 1142 so they are electrically connected.

Specifically, in the embodiment, the metal connector 1342 is exposed from the bottom of the connector opening. The packaging antenna connector 111 is electrically connected to the metal connector 1342, so that the packaging antenna connector 111 is electrically connected to the redistribution layer 103 via the metal connector 1342 and the metal column 1142.

The step of forming the first antenna structure 104 may include:

Forming the first antenna feeder line 1141 and the metal column 1142 on the second surface of the redistribution layer 103. The method of forming may include patterning via holes in the first packaging layer, followed by filling metal interconnecting materials. The method may also include welding metal wires on the second surface of the redistribution layer before deposing the first packaging layer. Both the first end of the first antenna feeder line 1141 and the first end of the metal column 1142 are electrically connected to the redistribution layer 103.

Packaging the second surface of the redistribution layer 103 with the first packaging layer 124. The first packaging layer 124 encloses the second surface of the redistribution layer 103, the first antenna feeder line 1141, the metal column 1142, and exposes the second end of the first antenna feeder line 1141 and the second end of the metal column 1142.

Forming the first antenna metal layer 1341 and the metal connector 1342 on the first packaging layer 124. The first antenna metal layer 1341 is electrically connected to the second end of the first antenna feeder line 1141, and the metal connector 1342 is electrically connected to the second end of the metal column 1142.

As an example, the method for forming the first antenna feeder line 1141 may include one or a combination of wire bonding, electroplating, and electroless plating. The materials of the first antenna feeder line 1141 may include one or a combination of copper, gold, silver, and aluminum. The method for forming the metal column 1142 may include one or a combination of wire bonding, electroplating, and electroless plating. The material of the metal column 1142 may include one or a combination of copper, gold, silver, and aluminum.

Specifically, it is preferable that the first antenna feeder line 1141 and the metal column 1142 are made of the same material; the first antenna metal layer 1341 and the metal connector 1342 are made of the same material. This facilitates the first antenna feeder line 1141 and the metal column 1142 being fabricated in the same process, the first electrode metal layer 1341 and the metal connecting member 1342 being fabricated in the same process, so as to improve production efficiency and reduce production cost.

As an example, the material of the first packaging layer 124 may include one of polyimide, silica gel, and epoxy resin. The method for making the first packaging layer 124 may include one of compression molding, transfer molding, liquid sealing molding, vacuum lamination, and spin coating. After forming the first packaging layer 124, a chemical mechanical polishing method may further be applied to the upper surface of the first packaging layer 124 to provide a flattened first packaging layer 124 to further improve product quality.

As an example, the method for making the first antenna metal layer 1341 and the metal connector 1342 may include one or a combination of physical vapor deposition, chemical vapor deposition, electroplating, or electroless plating.

Specifically, a metal layer may be formed on the surface of the first packaging layer 124 by physical vapor deposition or chemical vapor deposition. Then the first antenna metal layer 1341 and the metal connection member 1342 are patterned by etching. Alternatively, the first antenna metal layer 1341 and the metal connection member 1342 may be formed by using an electroplating process or an electroless plating process. For example, a metal seed layer is formed on the surface of the first packaging layer 124, and then patterning the photoresist. The first antenna metal layer 1341 and the metal connector 1342 are formed by electroplating, and finally the photoresist and the excess metal seed layer are removed.

As an example, a dielectric layer 105 may be included between the first antenna structure 104 and the subsequently prepared second antenna structure 106.

As shown in FIG. 4, the dielectric layer 105 encloses the first packaging layer 124, the first antenna metal layer 1341 and the metal connector 1342. The bonding force between the first packaging layer 124 and the second packaging layers 116 is improved by the dielectric layer 105, thereby improving the stability of the packaging antenna structure. The dielectric layer 105 may be formed by the same material and method as those of the first packaging layer 124 and the second packaging layer 116, in order to reduce process complexity and improve the bonding properties between the first packaging layer 124 and the second packaging layer 116.

Figure 5:
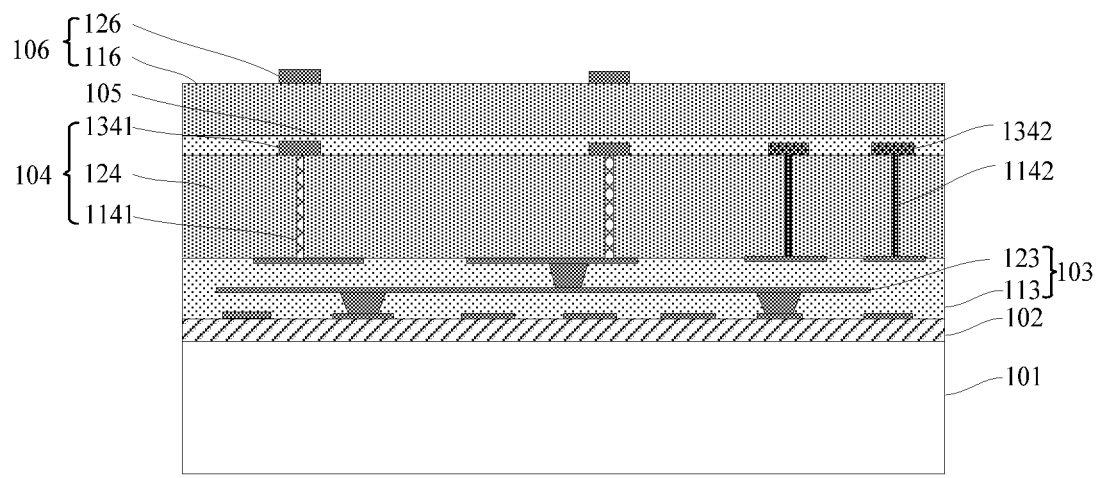

As shown in FIG. 5, forming the second antenna structure 106.

Specifically, the second antenna structure 106 includes the second packaging layer 116 and the second antenna metal layer 126. The second packaging layer 116 encloses the dielectric layer 105. The second antenna metal layer 126 is disposed on the second packaging layer 116. The materials and the making method of the second antenna structure 106 are the same as those of the first antenna structure 104, which is not described herein. Preferably, the materials of the second packaging layer 116, the dielectric layer 105, and the first packaging layer 124 are the same to improve the stability of the structure.

As an example, the second antenna metal layer 126 has an opening in a vertical direction of the metal connector 1342. The opening prevents the second antenna metal layer 126 from blocking the metal connector 1342, thereby further reducing the difficulty and cost for removing the second packaging layer 116 and exposing the metal connector 1342 in subsequent process.

As an example, the second antenna structure 106 may further include the second antenna feeder line (not shown) between the second antenna metal layer 126 and the first antenna metal layer 1341. The second antenna feeder line connects the second antenna metal layer 126 and the first antenna metal layer 1341, in order to further reduce signal loss of the packaging antenna structure.

As an example, the second surface of the redistribution layer 103 may include an N-layer antenna structure stacked thereon, where N≥2, to further improve the integration and integrated performance of the packaging antenna structure.

Specifically, in this embodiment, N is 2. That is, the first antenna structure 104 and the second antenna structure 106 are stacked on the second surface of the redistribution layer 103. In another embodiment, N may be 3, 4, 5, etc., to further improve the integration and integrated performance of the packaging antenna structure. The specific value of the N is not limited herein.

Figure 6:
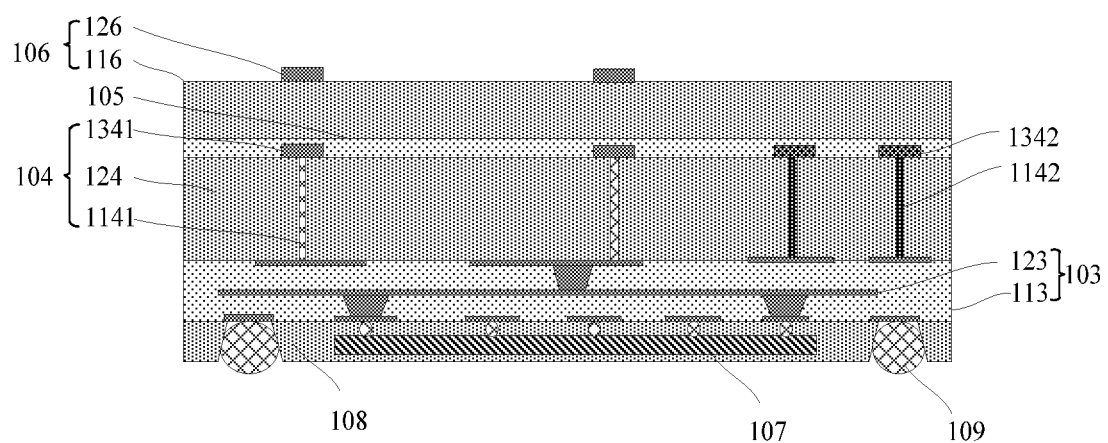

As shown in FIG. 6, exposing the first surface of the redistribution layer 103 by removing the separation layer 102 and the support substrate 101; and forming the semiconductor chip 107, the third packaging layer 108 and metal bumps 109 on the first surface of the redistribution layer 103.

Specifically, the third packaging layer 108 encloses the redistribution layer 103 and the semiconductor chip 107. The third packaging layer 108 can further be used as a support layer to improve the stability of the structure. The materials and preparation method of the third packaging layer 108 may be the same as those of the first packaging layer 124, and details are not described herein. The materials of the metal bumps 109 may include one or a combination of copper, nickel, tin, and silver. The method for making the metal bumps 109 may include: forming a through hole, by etching, in the third packaging layer 108 to expose the first surface of the redistribution layer 103; and forming the metal bump 109 in the through hole by one or a combination of reflow soldering and laser soldering. The method for making the metal bumps 109 is not limited to said methods.

As an example, the semiconductor chip 107 may include one or a combination of an active component and a passive component. The active component may include one or a combination of a transceiver integrated chip and a power management chip. The passive component may include one or a combination of a resistor, a capacitor and an inductor.

Figure 7:
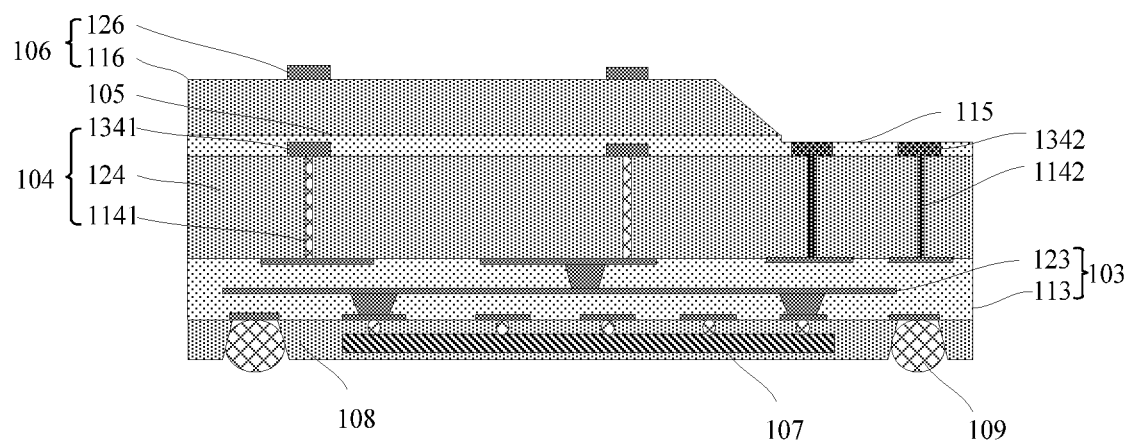

Then, as shown in FIG. 7, forming the connector opening 115 in the antenna structure.

Specifically, in this embodiment, the metal connecting member 1342 is exposed by removing part of the second packaging layer 116 and the dielectric layer 105. The method of removing the second packaging layer 116 and the dielectric layer 105 may include one or a combination of dry etching and wet etching.

Then, as shown in FIG. 8, forming the packaging antenna connector 111 in the connector opening. The packaging antenna connector 111 is electrically connected to the redistribution layer 103 by the metal connector 1342 and the metal column 1142, in order to obtain the packaging antenna module. The electrical terminal of the packaging antenna module includes the metal bump 109 and the packaging antenna connector 111, so that the packaging antenna module connects with the external through the packaging antenna connector 111, thereby reducing signal loss and further improving the competitive advantage of WLP AiP.

As an example, the method of forming the packaging antenna connector 111 in the connector opening may include one or a combination of reflow welding and laser welding.

Specifically, the type of the packaging antenna connector 111 is not limited herein. In this embodiment, the packaging antenna connector 111 is electrically connected to the metal connector 1342 by reflow welding. The antenna connector 111 is electrically connected to the redistribution layer 103 by the metal connector 1342 and the metal column 1142. After forming the packaging antenna connector 111, a cleaning process is optional to remove the welding debris.

As an example, the packaging antenna connector 111 is matched with a circuit board connector 112 on the circuit board 120. The electrical connection between packaging antenna structure and the circuit board 120 is achieved by electrical connection of the packaging antenna connector 111 and the circuit board connector 112. The circuit board 120 includes one or a combination of a flexible circuit board and a rigid circuit board.

Figure 9:
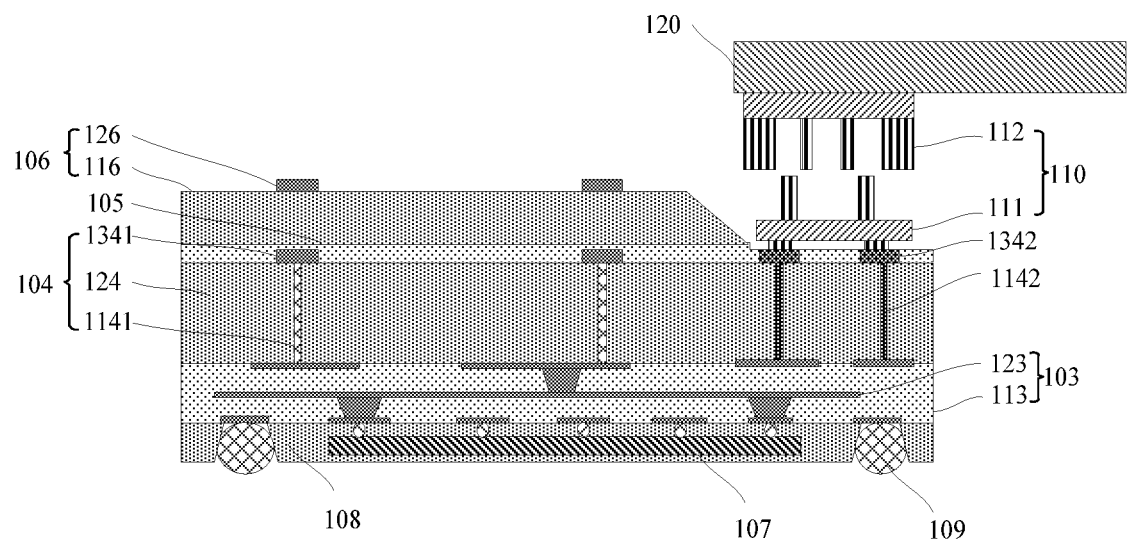
FIG. 9 is a schematic diagram of the packaging antenna module interconnecting with a circuit board according to the first embodiment of the present disclosure.

Specifically, as shown in FIG. 9, the circuit board 120 and the circuit board connector 112 are provided. The circuit board 120 may include one or a combination of a flexible circuit board and a rigid circuit board. The circuit board connector 112 electrically connects to the circuit board 120.

The circuit board connector 112 is matched with the packaging antenna connector 111, in order to form a connector 110 capable of good electrical connection, thereby interconnecting through the connector 110. The first packaging layer 124 can serve as a core layer to provide support.

Embodiment 2

Figure 11:
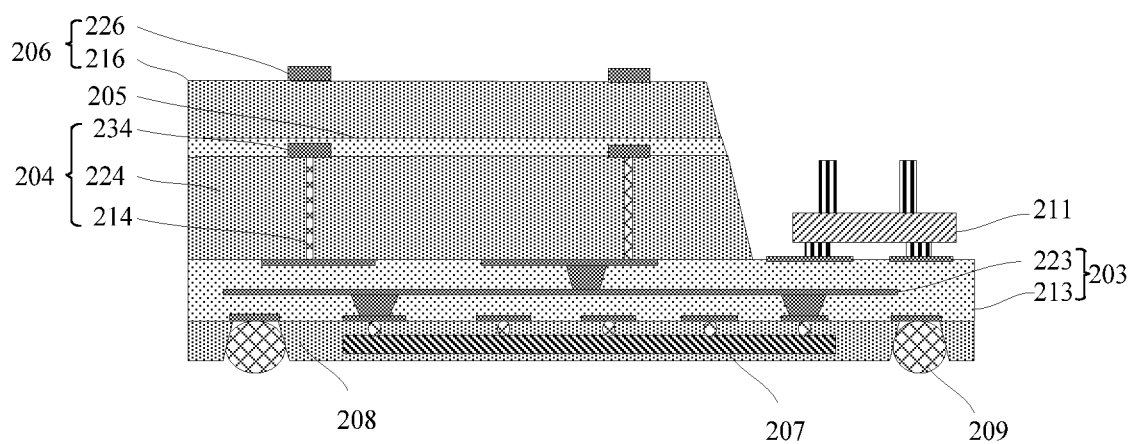
Figure 12:
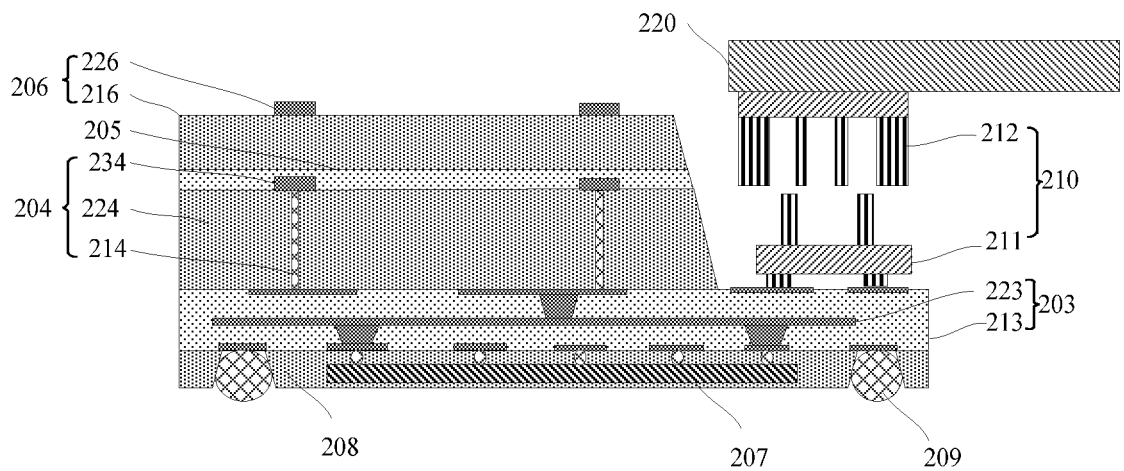
FIG. 12 is a schematic diagram illustrating packaging antenna module interconnecting with a circuit board according to the second embodiment of the present disclosure.

The Embodiment 2 is disclosed in FIG. 11 and FIG. 12. Referring to FIG. 11, which is a schematic cross-sectional diagram of an antenna packaging module according to this embodiment. This embodiment differs from the first embodiment in the position of the connector opening in the antenna packaging module, such that where to make an opening for the packaging antenna connector has more options.

The packaging antenna module includes a redistribution layer 203, an antenna structure, a semiconductor chip 207, a third packaging layer 208, a metal bump 209, and a packaging antenna connector 211. The redistribution layer 203 includes a first surface and a second surface opposite to the first surface. The antenna structure includes a connector opening, a first antenna structure 204 and a second antenna structure 206. The first antenna structure 204 and the second antenna structure 206 stack on the second surface of the redistribution layer 203. The first antenna structure 204 includes a first antenna feeder line 214, a first antenna metal layer 234 and a first packaging layer 224. The first end of the first antenna feeder line 214 and the redistribution layer 203 is electrically connected. The first packaging layer 224 embeds the first antenna feeder line 214 except exposing the second end of the first antenna feeder line 214. The first antenna metal layer 234 is disposed on the packaging layer 224, and is electrically connected to the second end of the first antenna feeder line 214. The second antenna structure 206 includes a second packaging layer 216 and a second antenna metal layer 226. The second packaging layer 216 encloses the first antenna metal layer 234. The second antenna metal layer 226 is disposed on the second packaging layer 216. The semiconductor chip 207 is disposed on the first surface of the redistribution layer 203, and is electrically connected with the redistribution layer 203. The metal bump 209 is disposed on the first surface of the redistribution layer 203 and is electrically connected to the redistribution layer 203. The third packaging layer 208 embeds the semiconductor chip 207 and the first surface of the redistribution layer 203 except exposing the metal a bump 209. The packaging antenna connector 211 is disposed in the connector opening and is electrically connected to the redistribution layer 203.

As an example, the metal wiring 223 of the redistribution layer 203 are exposed from the bottom of the connector opening. The packaging antenna connector 211 is electrically connected to the metal wiring 223.

Specifically, the redistribution layer 203 includes a wiring dielectric 213 and the metal wiring 223. In this embodiment, the metal wiring 223 of the redistribution layer 203 is directly exposed from the bottom of the connector opening. The packaging antenna connector 211 is electrically connected to the metal wiring 223 to electrical extraction through the packaging antenna connector 211, thereby broaden the selection range of the packaging antenna connector 211. The electrical terminal of the packaging antenna module includes the metal bump 209 and the packaging antenna connector 211. The packaging antenna module can interconnect with the external through the packaging antenna connector 211, thereby reducing signal loss and further improving the overall competitive advantage of WLP AiP.

Figure 10:
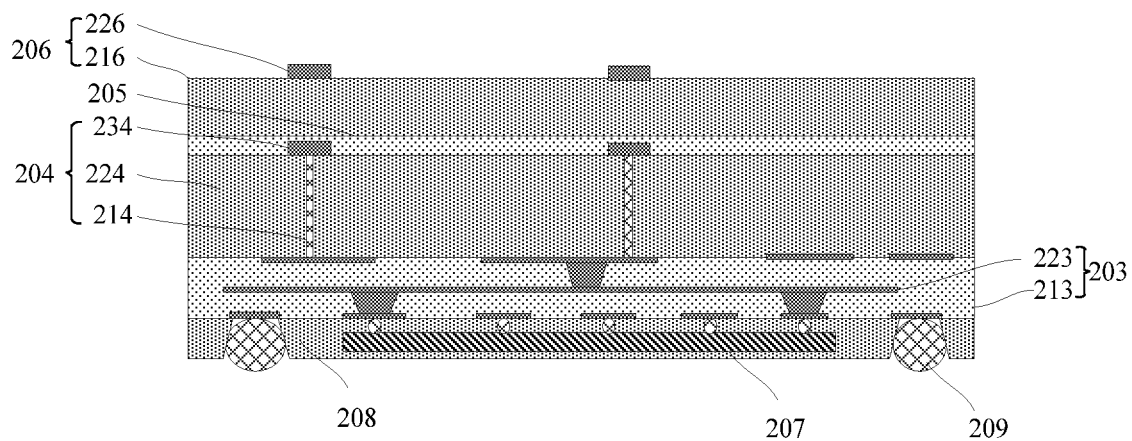
FIG. 10 and FIG. 11 are schematic diagrams illustrating the packaging antenna module according to the second embodiment of the present disclosure.

FIG. 10 and FIG. 11 are schematic diagrams illustrating the structure of the packaging antenna module in the embodiment. The dielectric layer 205 may be further included between the first antenna structure 204 and the second antenna structure 206. For the specific structure and preparation method of packaging antenna module, refer to the first embodiment. The details are not described herein again.

As shown in FIG. 12, a circuit board 220 and a circuit board connector 212 are provided. The circuit board 220 may include one or a combination of a flexible circuit board and a rigid circuit board. The circuit board connector 212 and the circuit board 220 is electrically connected, and the circuit board connector 212 is matched with the packaging antenna connector 211, so as to form a connector 210 capable of being electrically connected, and achieving interconnect through the connector 210. The third packaging layer 208 can serve as a core layer to provide mechanical support.

In summary, the present disclosure relates to the packaging antenna module and the making method according to the second embodiment. The packaging antenna connector disposed in the connector opening is electrically connected to the redistribution layer through the connector opening, and electrically interconnected with the package antenna connector. The antenna packaging module directly uses the packaging antenna as the electrical interconnect terminal. As a result, the flexibility of antenna packaging module layout is improved. Overall competitive advantage of WLP AiP is enhanced.

The above-mentioned embodiments are only used for exemplarily describing the principle and effects of the present disclosure instead of limiting the present disclosure. One skilled in the art may make modifications or changes to the above-mentioned embodiments without departing from the spirit and scope of the present disclosure. Therefore, all equivalent modifications or changes made by those who have common knowledge in the art without departing from the spirit and technical thought disclosed by the present disclosure shall be still enclosed by the claims of the present disclosure.

The invention claimed is:

1. A method for making an antenna packaging module, comprising the following steps:
    providing a packaging antenna structure, comprising;
        providing a substrate;
        disposing a redistribution layer on the substrate, wherein the redistribution layer comprises:
        a first surface and a second surface opposite to the first surface;
        an antenna structure, the antenna comprising a first antenna structure and a second antenna structure stacked on the second surface of the redistribution layer;
            wherein the first antenna structure includes a first antenna feeder line, a first antenna metal layer and a first packaging layer, wherein a first end of the first antenna feeder line is electrically connected to the redistribution layer, and the first packaging layer encloses the second surface of the redistribution layer and the first antenna feeder line, and exposes a second end of the first antenna feeder line, the first antenna metal layer is disposed on the first packaging layer and electrically connected to the second end of the first antenna feeder line;
            wherein the second antenna structure includes a second packaging layer and a second antenna metal layer, wherein the second packaging layer encloses the first antenna metal layer and the first packaging layer, and the second antenna metal layer is disposed on the second packaging layer;
        providing a semiconductor chip, wherein the semiconductor chip is disposed on the first surface of the redistribution layer, and electrically connected with the redistribution layer;
        providing a metal bump, wherein the metal bump is disposed on and electrically connected to the first surface of the redistribution layer;
        disposing a third packaging layer, wherein the third packing layer embeds the semiconductor chip and the first surface of the redistribution layer, except exposing the metal bump;
        forming an opening in the antenna structure; and
        forming a connector of packing antenna in the opening, wherein the connector is electrically connected with the first surface of the redistribution layer.

2. The method for making the antenna packaging module according to claim 1, wherein the packaging antenna connector is interconnected with a circuit board connector on the circuit board; wherein the circuit board comprises one or a combination of a flexible circuit board and a rigid circuit board.

3. The method for making the antenna packaging module according to claim 1, wherein the first antenna structure further comprises a metal column and a metal connector, wherein a first end of the metal column is electrically connected to the redistribution layer, wherein the first packaging layer embeds the metal column except exposing a second end of the metal column, wherein the metal connector is disposed on the first packaging layer and electrically connected to the second end of the metal column; wherein the bottom of the connector opening exposes the metal connector, and wherein the packaging antenna connector is electronically connected to the metal connector, so that the metal connector and the metal column are electrically connect to the redistribution layer.

4. The method for making the antenna packaging module according to claim 1, wherein a metal wiring of the redistribution layer is exposed from a bottom of the connector opening, and wherein the packaging antenna connector is electrically connected to the metal wiring.

5. The method for making the antenna packaging module according to claim 1, wherein a dielectric layer is disposed between the first antenna structure and the second antenna structure.

6. The method for making the antenna packaging module according to claim 1, wherein the second antenna structure further comprises a second antenna feeder line disposed between the second antenna metal layer and the first antenna metal layer, and the second antenna metal layer is connected to the first antenna metal layer via the second antenna feeder line.

7. The method for making the antenna packaging module according to claim 1, wherein forming the packaging antenna connector comprises one or the combination of reflow welding and laser welding.

8. The method for making the antenna packaging module according to claim 1, wherein forming the first antenna feeder line includes one or a combination of wire bonding, electroplating, and electroless plating, and wherein the material of the first antenna feeder line comprises one or a combination of copper, gold, silver, and aluminum.

9. The method for making the antenna packaging module according to claim 1, wherein forming the connector opening comprises one or a combination of dry etching and wet etching.

10. The method for making the antenna packaging module according to claim 1, wherein the semiconductor chip comprises one or a combination of an active component and a passive component; the active component comprises one or a combination of a transceiver chip and a power management chip; the passive component comprises one or a combination of resistors, capacitors and inductors.

11. An antenna packaging module, comprising:
a substrate and a separating layer;
a redistribution layer, wherein the redistribution layer comprises a first surface on the separating layer and a second surface opposite to the first surface;
an antenna structure, wherein the antenna structure comprises a first antenna, a second antenna stacked on the second surface of the redistribution layer and a connector opening;
wherein the first antenna structure includes a first antenna feeder line, a first antenna metal layer and a first packaging layer, wherein a first end of the first antenna feeder line is electrically connected to the redistribution layer, wherein the first packaging layer is disposed on the first antenna feeder line leaving a second end of the first antenna feeder line exposed, wherein the first antenna metal layer is disposed on the first packaging layer and electrically connected to the second end of the first antenna feeder line;
wherein the second antenna structure includes a second packaging layer and a second antenna metal layer, wherein the second packaging layer is disposed on the first antenna metal layer, and wherein the second antenna metal layer is disposed on the second packaging layer;
a semiconductor chip, wherein the semiconductor chip is disposed on the first surface of the redistribution layer, and electrically connected to the redistribution layer;
a metal bump, wherein the mental bump is disposed on the first surface of the redistribution layer, and electrically connected to the redistribution layer;
a third packaging layer, wherein the third packaging encloses the semiconductor chip and the first surface of the redistribution layer, and exposing the metal bump; and
a packaging antenna connector, wherein the packaging antenna connector is disposed in the connector opening, and electrically connected to the redistribution layer.

12. The antenna packaging module according to claim 11, wherein the packaging antenna connector is electrically connected with a circuit board connector on the circuit board; and wherein the circuit board comprises one or a combination of a flexible circuit board and a rigid circuit.

13. The antenna packaging module according to claim 11, wherein the first antenna structure further comprises a metal column and a metal connector, wherein the first end of the metal column is electrically connected to the redistribution layer, wherein the first packaging layer embeds the second surface of the redistribution layer and the metal column, wherein the metal connector is located on the first packaging layer and electrically connected to the second end of the metal column; wherein the bottom of the connector opening exposes the metal connector; wherein the packaging antenna is electrically connected to the metal connector.

14. The antenna packaging module according to claim 11, wherein a metal wiring of the redistribution layer is exposed at a bottom of the connector opening, and the packaging antenna connector is electrically connected to the metal wiring.

15. The antenna packaging module according to claim 11, wherein a dielectric layer is disposed between the first antenna structure and the second antenna structure.

16. The antenna packaging module according to claim 11, wherein the second antenna structure further comprises a second antenna feeder line disposed between the second antenna metal layer and the first antenna metal layer, and wherein the second antenna structure is connected to the second antenna metal layer and the first antenna metal layer via the second antenna feeder line.

17. The antenna packaging module according to claim 11, wherein the first antenna feeder line comprises one or a combination of a copper feeder line, a gold feeder line, a silver feeder line, and an aluminum feeder line.

18. The antenna packaging module according to claim 11, wherein the semiconductor chip comprises one or a combination of an active component and a passive component; wherein the active component comprises one or a combination of a transceiver chip and a power management chip; wherein the passive component comprises one or a combination of resistors, capacitors and inductors.

* * * * *